(12) United States Patent
Puttock et al.

(10) Patent No.: US 6,649,527 B2
(45) Date of Patent: Nov. 18, 2003

(54) METHOD OF ETCHING A SUBSTRATE

(75) Inventors: Mark Puttock, Grenoble (FR); Graham Richard Powell, Kent (GB); Kevin Powell, Bristol (GB); David Andrew Tossell, Bristol (GB); Matthew Peter Martin, Wiltshire (GB)

(73) Assignee: Trikon Holdings Limited, Gwent (GB)

( * ) Notice: Subject to any disclaimer, the term of this patent is extended or adjusted under 35 U.S.C. 154(b) by 79 days.

(21) Appl. No.: 10/106,823

(22) Filed: Mar. 27, 2002

(65) Prior Publication Data

US 2002/0142608 A1 Oct. 3, 2002

(30) Foreign Application Priority Data

Mar. 30, 2001 (GB) ............................................. 0108002

(51) Int. Cl.[7] ............................................. H01L 21/302
(52) U.S. Cl. ........................ 438/706; 156/345; 361/234
(58) Field of Search ................................ 438/706, 714, 438/716; 156/345; 361/234

(56) References Cited

U.S. PATENT DOCUMENTS

| | | | | |
|---|---|---|---|---|
| 5,315,473 A | * | 5/1994 | Collins et al. ............... | 361/234 |
| 5,382,469 A | * | 1/1995 | Kubota et al. ............... | 428/332 |
| 5,522,131 A | * | 6/1996 | Steger ........................... | 29/829 |
| 6,033,482 A | * | 3/2000 | Parkhe ........................ | 118/728 |
| 6,185,085 B1 | * | 2/2001 | Hwang et al. ............... | 361/234 |

FOREIGN PATENT DOCUMENTS

| | | |
|---|---|---|
| EP | 0 644 577 A1 | 3/1995 |
| JP | 9-191005 | 7/1997 |
| JP | 10-163308 | 6/1998 |
| JP | 2000-232098 | 8/2000 |

* cited by examiner

*Primary Examiner*—Kin-Chan Chen
(74) *Attorney, Agent, or Firm*—Volentine Francos, PLLC

(57) ABSTRACT

This invention relates to a method of etching a substrate in a chamber on an electrostatic chuck, which defines a gas cooling path at the substrate/chuck interface. The method includes electrostatically clamping the substrate on the chuck with gas in the gas path being at a first pressure; etching the substrate at a first power; detecting the end point for the etc; reducing the gas pressure to a second pressure at which the substrate floats on a gas; and over etching the wafer at a second power, which is lower than the first power.

16 Claims, 1 Drawing Sheet

METHOD OF ETCHING A SUBSTRATE

This invention relates to a method of etching a substrate in a chamber on an electrostatic chuck, which defines a gas cooling path at the substrate/chuck interface.

Electrostatic chucks are well known for retaining semi-conductor wafers and other substrates on a chuck utilising electrostatic force. Such chucks depend upon the presence of an electrically conducting layer somewhere within the substrate. For insulating substrates, this layer is often the top film, that is to be etched, which is usually the only conducting layer on the substrate, and so the clamping force can break down at the point at which the conductive layer is etched from the surface of the substrate and becomes discontinuous. This can cause a number of problems including the substrate blowing off the chuck and an inability to perform an over etch step to remove material from facets or features on the substrate.

The present invention consists in a method of etching a substrate in a chamber on an electrostatic chuck which defines the gas cooling path at the substrate/chuck interface including:

i. electrostatically clamping the substrate on the chuck with the gas in the gas path being at a first pressure;
ii. etching the substrate at a first power;
iii. detecting the end point for the etch;
iv. reducing the gas pressure to a second pressure; and
v. over-etching the wafer at a second power, which is lower than the first power.

It will be observed that the Applicant has realised that by reducing the gas pressure one can reach a point at which the substrate simply floats on the gas; the actual pressure therefore being essentially determined by the mass of the substrate. Because the over-etching is then carried out at a reduced power, the reduced gas flow can still provide sufficient cooling. As the over-etch is only required for a very limited period for the removal of a small amount of residual material, the reduced etching rate is acceptable for throughput purposes.

It is particularly preferred that the substrate is laterally restrained at least during steps iv and/or v and conveniently this can be done by providing a circumjacent wall, which may form part of a uniformity ring. As the wall needs to confine the wafer to its processing position, the clearance between the substrate edge and the wall must be small and it is therefore preferred that the uniformity ring has an enlarged lead in mouth.

Conveniently the cooling gas may be helium and for a typical semi-conductor wafer, the first pressure will be in the range of 6–9.5 torr, whilst the second pressure will be in the range 1–2 torr. However, as has been indicated above, the second pressure in particular is to a great extent determined by the mass of the substrate.

The gas path may, at least in part, be defined by radial and/or coaxial grooves in the chuck surface, in which case it is preferred that the grooves are wider than they are deep. This is particularly the case where the electrostatic chuck has a thick dielectric layer and is being operated at voltages in the region of a few thousand volts. The wide grooves are easier to post form and in the above construction, the loss of clamping over the width of the groove is not a serious problem. Thus the grooves may be between 1 and 5 mm wide and of the order of 200 $\mu$m deep.

It is particularly preferred that these wide and shallow grooves are used in a so called "thick dielectric" electrostatic chuck such as described in our U.S. patent application Ser. No. 09/150,669, now U.S. Pat. No. 6,256,186, the contents of which are incorporated hereby incorporated by reference. Such thick chucks allow significant voltages to be used and the lack of clamping over the width of the groove is less significant. It has also been found that such chucks are particularly effective at clamping III/V compound wafers, which are often processed on sapphire carriers. The width of the grooves enhances cooling at the low pressures used when the wafer becomes unclamped.

Although the invention has been defined above it is to be understood it includes any inventive combination of the features set out above or in the following description.

The invention may be performed in various ways as specific embodiments will now be described with reference to the accompanying drawing, in which.

Figure 1:
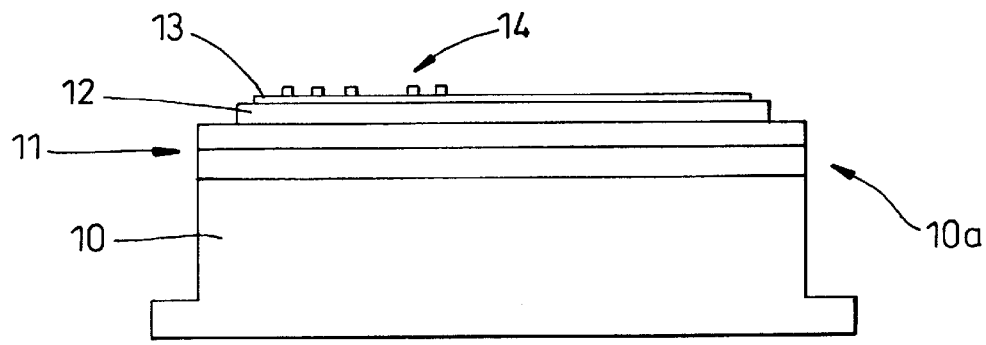
FIG. 1 is a schematic side view showing a wafer on an electrostatic chuck.
Figure 4:
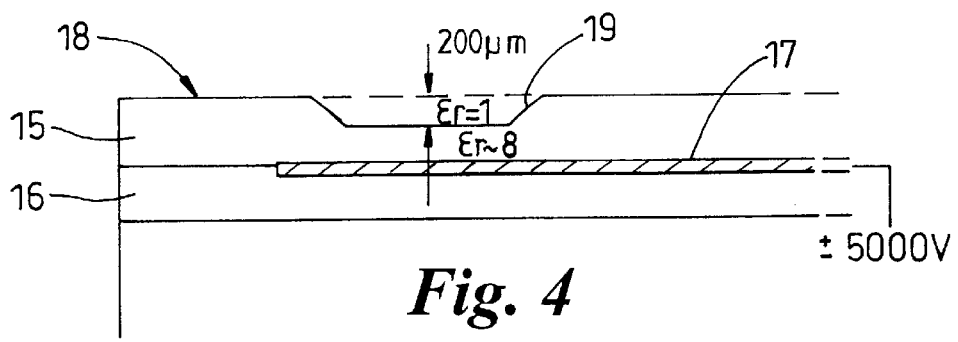
FIG. 4 is an enlarged view of a portion of the electrostatic chuck illustrating a groove.

In FIG. 1 a platen 10 with an electrostatic chuck 10a includes insulating portion 11 on its upper surface for retaining a wafer 12. The wafer 12 has a metallised conducting layer 13 deposited thereon and a resist pattern on the upper surface of the metal layer 13. The resist pattern is shown schematically at 14. The chuck 10a is preferably of the type described in our corresponding U.S. patent application Ser. No. 09/150,699. As can be seen in FIG. 4 the chuck 10a comprises a sandwich of ceramic layers 15, 16 (which make up the insulating portion 11) between which is an electrode 17 that can be driven at plus or minus 5,000 volts. This combination of a thick ceramic layer with a high voltage is particularly suitable for clamping through thick insulating carriers for the reasons set out in the above U.S. Patent Application and the high voltages in particular enable good clamping through sapphire carriers, as mentioned above.

As is common with electrostatic chucks, the upper ceramic layer 15 is configured to allow a flow of helium at the chuck/wafer interface to cool the wafer during the etch process. Typically there is an array of radial and/or coaxial grooves formed in the upper surface 18 of the upper ceramic layer 15 and an example of such a groove is shown at 19. As helium passes along the gas path defined by these grooves, it cools the wafer. Normally the electrostatic clamping is sufficiently strong for the helium to be at a reasonably high pressure (e.g. 6–9.5 torr) to allow for good cooling of the wafer.

Figure 2:
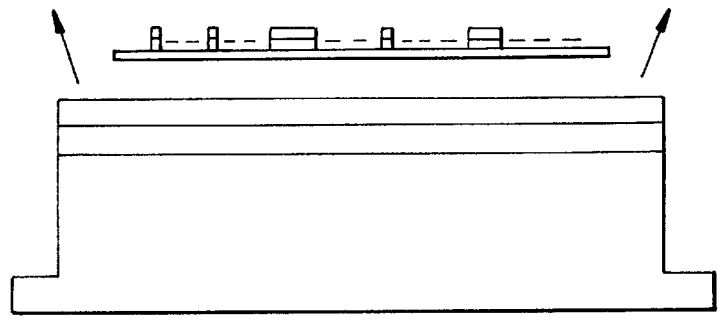
FIG. 2 is the corresponding view to FIG. 1 showing what normally happens when the metallic layer on the wafer is etched so that it becomes discontinuous.

As is well understood, the clamping of the wafer 12 on the chuck 11 is dependent on there being a conductive layer in or on the wafer 12. In the arrangement illustrated in FIG. 1 the initial etch will eat through the metallic layer 13 between the resist and when at least parts of the metallic layer are etched right through to the insulating wafer 12, the clamping force will be broken. In this circumstance the wafer would then blow off the platen 10 due to the pressure of helium. This is illustrated in FIG. 2.

The applicants have realised, that if they monitor the end point of the etch, they can anticipate the point at which blow off is likely to occur and avoid that consequence, by significantly reducing the helium pressure. This can be done by any conventional end point detection technique, such as optical depth measuring apparatus or it could be done by monitoring the leakage at the helium wafer interface, as this will occur as the clamping force begins to reduce.

As has been indicated above, the point at which the metallic layer 13 becomes discontinuous is not quite the point at which the necessary etching process is complete, because there may be residual material on the facets and features which have been previously formed in the surface of the wafer.

The applicants have appreciated that if they lower the power of the etch to the level at which the reduced helium pressure suffices to cool the resultant heat, they can continue the etch process, without any electrostatic clamping. This approach would not suffice for the main etch, because it would be too slow, but for the "over etch" stage the applicants have discovered that the etch rate is sufficient.

Figure 3:
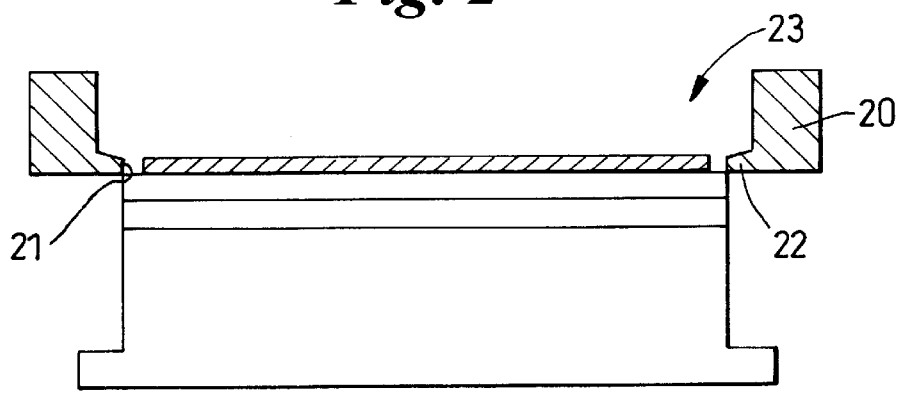
FIG. 3 illustrates the applicants over etch configuration.

The exact pressure to which the helium will be reduced is essentially dependent on the mass of the wafer and the intention is to allow for the wafer to just float above the electrostatic chuck. Although in theory this arrangement should suffice and be stable, in practice, lack of symmetry in the grooves or the wafer under surface could cause the wafer 12 to move laterally. For this reason the applicants use a specifically formed uniformity ring 20 (see FIG. 3). This ring 20 defines a wall 21, which extends circumjacent the periphery of the wafer 12. In order to maintain the position of the wafer 12, the wall 21 needs to be very close to the working location and there could be problems of placement when the wafer is introduced into the chamber containing the chuck 11. For this reason, the wall 21 is formed on an inwardly projecting lip 22 which acts as a guide for the wafer after it has been introduced through the wider mouth 23.

Although uniformity rings are well known, they are generally not formed to lie so tightly adjacent the wafer location, for the very reasons mentioned above.

Another factor which makes the proposed method particularly effective, is the formation of relatively wide and shallow grooves 19. Usually, designers attempt to have their cooling grooves as narrow as possible, because of the loss of clamping over the width of the groove. However, by using a thick ceramic layer and a high voltage, the applicants are able to clamp sufficiently effectively, whilst having wide grooves which provide more efficient cooling with relatively low gas flow rates. This is particularly desirable at the lower pressures (e.g. 1–2 torr) which are desirably used during the over etch stage.

What is claimed is:

1. A method of etching a substrate in a chamber on an electrostatic chuck which defines a gas cooling path at the substrate chuck interface including:
   i. electrostatically clamping the substrate on the chuck with the gas in the gas path being at a first pressure;
   ii. etching the substrate at a first power;
   iii. detecting the end point for the etch;
   iv. reducing the gas pressure to a second pressure at which the substrate floats on the gas; and
   v. over-etching the wafer at a second power, which is lower than the first power.

2. A method as claimed in claim 1 including laterally restraining the substrate at least during steps iv and/or v.

3. A method as claimed in claim 2 whereas the substrate is restrained by a circumjacent wall.

4. A method as claimed in claim 3 wherein the gas is helium.

5. A method as claimed in claim 2 wherein the gas is helium.

6. A method as claimed in claim 1 wherein the gas is helium.

7. A method as claimed claim 1 wherein the first pressure is in the range of 6–9.5 torr.

8. A method as claimed in claim 7 wherein the second pressure is in the range 1–2 torr.

9. A method as claimed in claim 1 wherein the second pressure is in the range 1–2 torr.

10. A method as claimed in claim 1 wherein the gas path is at least in part defined by radial grooves in the chuck surface.

11. A method as claimed in claim 10 wherein the grooves are wider than they are deep.

12. A method as claimed in claim 11 wherein the substrate is silicon, the grooves are substantially 1 mm wide and substantially 200 $\mu$m deep.

13. A method as claimed in claim 11 wherein the substrate is silicon and the grooves are substantially 5 mm wide and substantially 200 $\mu$m deep.

14. A method as claimed in claim 1 of the preceding claims wherein the second power is sufficiently low to create no more heat than can be substantially removed by the gas at the second pressure.

15. A method of etching a substrate in a chamber on an electrostatic chuck which defines a gas cooling path at the substrate check interface including:
   i. electrostatically clamping the substrate on the chuck with the gas in the gas path being at a first pressure;
   ii. etching the substrate at a first power;
   iii. detecting the end point for the etch;
   iv. reducing the gas pressure to a second pressure at which the substrate floats on the gas; and
   v. over-etching the wafer at a second power, which is lower than the first power, the method including laterally restraining the substrate at least during steps iv and/or v.

16. A method of etching a substrate in a chamber on an electrostatic chuck which defines a gas cooling path at the substrate chuck interface including:
   i. electrostatically clamping the substrate on the chuck with the gas in the gas path being at a first pressure;
   ii. etching the substrate at a first power;
   iii. detecting the end point for the etch;
   iv. reducing the gas pressure to a second pressure at which the substrate floats on the gas; and
   v. over-etching the wafer at a second power, which is lower than the first power wherein the second power is sufficiently low to create no more heat than an be substantially removed by the gas at the second pressure.

* * * * *

UNITED STATES PATENT AND TRADEMARK OFFICE
CERTIFICATE OF CORRECTION

PATENT NO. : 6,649,527 B2
DATED : November 18, 2003
INVENTOR(S) : Mark Puttock et al.

It is certified that error appears in the above-identified patent and that said Letters Patent is hereby corrected as shown below:

Column 3,
Line 58, change "wafer" to -- substrate --.

Column 4,
Line 41, change "wafer" to -- substrate --.
Line 55, change "wafer" to -- substrate --.

Signed and Sealed this

Twenty-second Day of March, 2005

JON W. DUDAS
*Director of the United States Patent and Trademark Office*